United States Patent
Stone et al.

(10) Patent No.: US 7,220,132 B2
(45) Date of Patent: May 22, 2007

(54) TILTED LAND GRID ARRAY PACKAGE AND SOCKET, SYSTEMS, AND METHODS

(75) Inventors: Brent S. Stone, Chandler, AZ (US); Michael J. Walk, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/880,149

(22) Filed: Jun. 28, 2004

(65) Prior Publication Data

US 2005/0287828 A1    Dec. 29, 2005

(51) Int. Cl.
*H01R 12/00* (2006.01)

(52) U.S. Cl. .......................................... 439/66; 439/71

(58) Field of Classification Search ........ 257/700–703, 257/698, 125, 706, 737, 743; 439/66, 71; 324/754

See application file for complete search history.

(56) References Cited

U.S. PATENT DOCUMENTS

| | | | |
|---|---|---|---|
| 5,947,749 A * | 9/1999 | Rathburn ...................... 439/66 |
| 6,220,870 B1 * | 4/2001 | Barabi et al. ................. 439/71 |
| 6,247,938 B1 * | 6/2001 | Rathburn ...................... 439/66 |
| 6,250,933 B1 * | 6/2001 | Khoury et al. ................ 439/66 |
| 6,437,591 B1 * | 8/2002 | Farnworth et al. .......... 324/765 |
| 6,534,723 B1 | 3/2003 | Asai et al. ................... 174/255 |
| 6,586,684 B2 | 7/2003 | Frutschy et al. ............ 174/260 |
| 6,669,489 B1 | 12/2003 | Dozier, II et al. |
| 6,916,181 B2 * | 7/2005 | Brown et al. ................. 439/66 |
| 2001/0024890 A1 * | 9/2001 | Maruyama et al. .......... 439/66 |
| 2002/0121689 A1 | 9/2002 | Honda ......................... 257/700 |
| 2005/0181655 A1 * | 8/2005 | Haba et al. ................. 439/331 |
| 2005/0285255 A1 * | 12/2005 | Walk .......................... 257/700 |

OTHER PUBLICATIONS

"cLGA Land Grid Array Socket System: Product Description", http://www.lgasockets.com/desc/default.htm, (2003), 3 pages.

Corbin, J. S., et al., "Land grid array sockets for server applications", *IBM J. Res. & Dev.*, vol. 46, No. 6, (Nov. 2002), 763-778.

* cited by examiner

*Primary Examiner*—Michael C. Zarroli
(74) *Attorney, Agent, or Firm*—Schwegman, Lundberg, Woessner & Kluth, P.A.

(57) ABSTRACT

A electrical interface for an electronic package, using lands on the package which are non-planar with metal layers within the package. This non-planar or tilted land grid array (TLGA) package is assembled with a complementary TLGA socket to make electronic connection to the package.

19 Claims, 2 Drawing Sheets

TILTED LAND GRID ARRAY PACKAGE AND SOCKET, SYSTEMS, AND METHODS

RELATED APPLICATION

This application is related to pending U.S. patent application Ser. No. 10/880,154, titled "Device and Method for Tilted Land Grid Array Interconnects on a Coreless Substrate Package," filed on even date herewith and assigned to Intel Corporation, the assignee of the resent application.

TECHNICAL FIELD

Various embodiments described herein relate to packaging for electronic circuits generally, such as apparatus, systems, and methods used to improve interconnection between packages.

BACKGROUND INFORMATION

As electronic circuit chips become increasingly thinner to accommodate a new generation of electronic devices, such as PDAs, cell phones and the like, it is a challenge to provide them with the capability to be interconnected by smaller and smaller connectors. The ability to make connections to smaller and thinner chips is affected by any flexing of the chips or misalignment of the chips and a connector carrying multiple contacts to mate with lands arrayed on the chips.

DETAILED DESCRIPTION

The term substrate generally refers to a physical structure or layer that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting materials, or combinations of semiconducting, non-semiconducting, conductive and insulating materials.

Relative direction terms as used in this description are defined with reference to the conventional horizontal, large plane or surface of a board, such as a motherboard, where electrical components have typically been attached, regardless of the orientation of the board. Likewise, when referring to components that are adapted for use on circuit boards, terms such as "top surface" or "bottom surface" are defined as surfaces of components that are substantially parallel to the conventional horizontal, large plane or surface of the board. The term "vertical" refers to a direction perpendicular to the horizontal as defined above.

Figure 1:
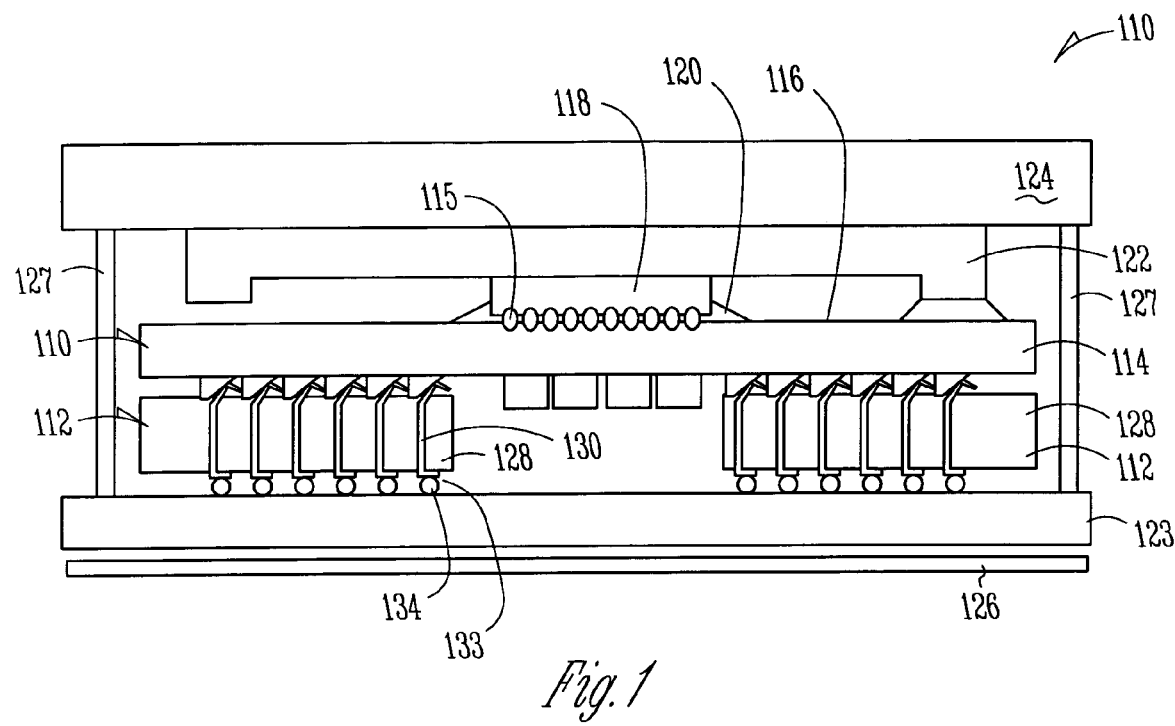
FIG. 1 is cross-sectional view of a tilted land grid array according to according to various embodiments.

FIG. 1 is a cross-section elevation of a device 110 which includes a package 110 and at least one socket 112 according to an embodiment of the invention. In an embodiment, package 110 includes a circuit substrate 114. Substrate 114 has a plurality of stacked, parallel layers (not visible in FIG. 1), some of which are insulating, some of which are conductive. In an embodiment, an insulating layer having conductive traces or leads on its planar surface may be referred to herein as a conductive layer, though the entire surface thereof may not be metal coated. In an embodiment a conductive layer may be formed entirely of metal or may be metal substantially covering a surface of an insulating layer.

In FIG. 1, package 110 has an upper surface 116 of substrate 114 to which an electronic circuit die 118 is secured. In an embodiment, die 118 is mechanically secured to the top surface 116 of substrate 114 by a suitable bonding material 120. In an embodiment, terminals on die 118 are electrically connected to electrical traces on substrate 114 by solder bumps 115 which are reflowed to make electrical and mechanical connections from the die 118 to substrate 114.

Die 118 has the side that is not bonded to substrate 114 thermally coupled to heat spreader 122 which provides a thermally conductive path to keep the entire top surface of die 118 at a uniform temperature. In an embodiment the area of heat spreader 122 is substantially greater than the area of the top surface of die 118 and is in turn thermally coupled to a heat sink 124 which provides a large thermal mass for receiving and dissipating heat from die 118.

In FIG. 1, socket 112 has a printed circuit board 123 mounted over a backing plate 126. In an embodiment, bolts 127 or other securing structure holds printed circuit board 123 and backing plate 126 so that they can support socket 112 beneath substrate 114.

In FIG. 1, socket 112 includes a suitable array of contacts which are mounted on a socket substrate 128. Socket substrate 128 carries at least one socket contact, one of which is marked 130 in FIG. 1. In FIGS. 1 and 2, one end 132 of socket contact 130 is bonded by a solder bump 133 to a terminal 134 on an upper surface 135 of printed circuit board 123. A body portion 136 of socket contact 130 extends through a passage in substrate 128 and an upper socket contact portion 138 extends above the surface of substrate 128.

Figure 2A:
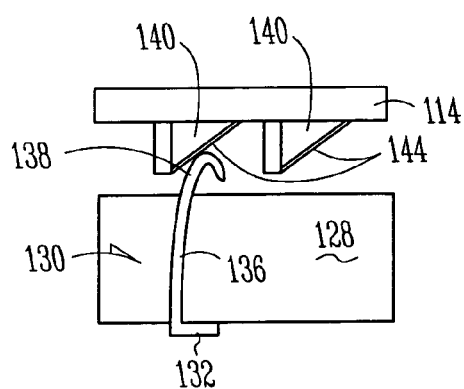
FIGS. 2A & 2B are detail views showing the action of socket contacts according to various embodiments.
Figure 2B:
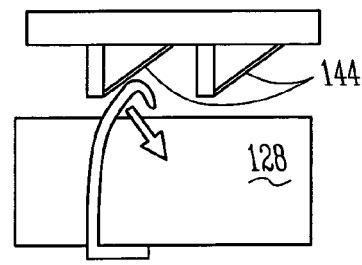

FIGS. 2A and 2B are detail views of an embodiment of one of the at least one socket contact 130 of the socket 112. In an embodiment shown in FIGS. 2A and 2B, surface features 140 can be seen extending from the lower surface of substrate 114 toward socket substrate 128. A portion of surface feature 140 is shown in an embodiment as having a conductive land 144 formed over it. In an embodiment, land 144 is non-planar to the surface of substrate 114. In an embodiment, land 144 is non-planar to the layers of which comprise substrate 114. Thus the land 144 is tilted with respect to the planar surfaces of substrate 144 and planes of the metal layers within substrate 114. In an embodiment, the angle of the tilt is between 30 and 60 degrees. In an embodiment, the tilt is about 45 degrees. The plurality of lands 144 is referred to herein as a tilted land grid array (TLGA) since the lands are tilted rather than parallel to the surfaces of the substrate and metal layers within the substrate as in a land grid array.

As shown in FIGS. 2A and 2B, in an embodiment, the upper socket contact portion 138 conductively engages land 144 as substrates 128 and 114 are moved closer together. As contact is made and the substrates are moved still closer together, the upper contact portion 138 flexes both laterally and vertically as it moves along land 144.

In an embodiment, the contact portion 138 provides a wiping contact with land 144 as the socket portion and the substrate are mated. The contact portion 138 has a radius of curvature which provides an arcuate surface which bears upon and slides along the surface of land 144 in response to the lateral and vertical flexing. Such a wiping contact may provide a more positive contact by wiping away impurities that may be present on either surface. Again, this is in contrast to those Land Grid Array systems in which the socket contacts flex only vertically upon engagement with non-tilted lands on the substrate. Such Land Grid Array connection systems have required tight control of mechanical warpage of the package to facilitate mating with a Land Grid Array socket. Putting tight limitations on warpage is a challenge in connection with large packages having sides having a length exceeding about 50 mm, for example.

Figure 3A:
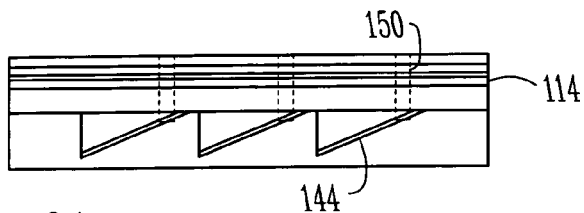
FIGS. 3A and 3B are detail views of an article according to various embodiments.
Figure 3B:
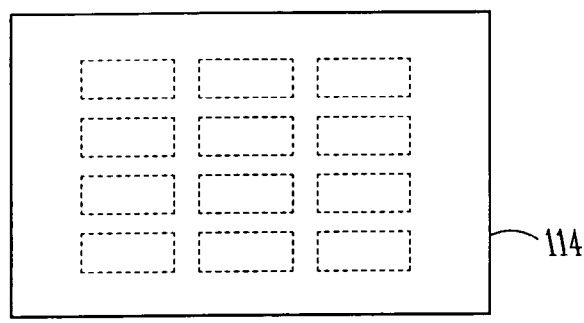

FIGS. 3A and 3B are a depiction of an exemplary embodiment showing three surface features 140 which are disposed recessed into the lower surface of substrate 114. FIG. 3A is a cross-section side-elevational view of the lower portion of circuit substrate 114 showing that the recessed lands 144 are below the surface of substrate 114 and tilted relative thereto. FIG. 4B is a view of a portion of substrate 114 showing twelve recessed, tilted land grid array contact lands. Vias 150 are shown to connect the conductive lands 144 to conductive layers within substrate 114.

Figure 4:
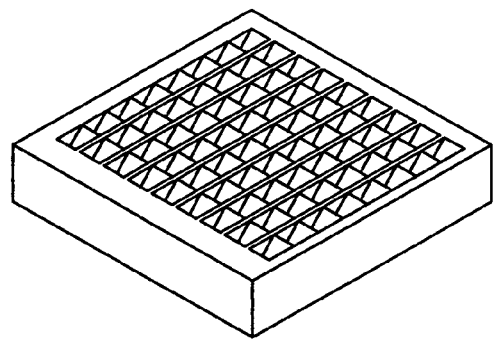
FIG. 4 is an isometric view of a bottom side of a package according to various embodiments.

FIG. 4 is an isometric view of the recessed tilted land grid array on a surface of substrate 144.

Figure 5A:
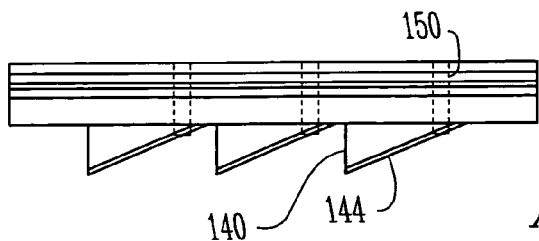
FIGS. 5A and 5B are detail views according to various embodiments.
Figure 5B:
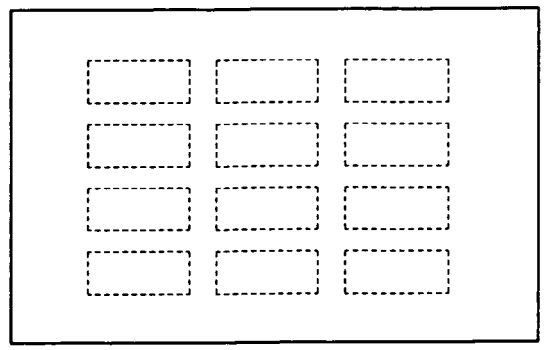

FIGS. 5A and 5B are a depiction of an exemplary embodiment showing three surface features 140 which are disposed projecting from the lower surface of substrate 114. FIG. 5A is a side-elevational cross-sectional view of the lower portion of circuit substrate 114 showing that the lands 144 project from the surface of substrate 114 and tilt relative thereto. FIG. 5B is a view of a portion of substrate 114 showing twelve projecting, tilted land grid array contact lands. Vias 150 are shown to connect the conductive lands 144 to conductive layers within substrate 114.

In an embodiment, the surface features 140 are formed in thermoset or thermoplastic material by using microtool/stamping tools. In an embodiment, the tools form an imprint on a B stage cured epoxy material which is then cured further to insure that the features remain after further processing. After the feature 140 is formed by imprinting, it is cleaned using a plasma etch or other conventional desmearing and material removal techniques. In an embodiment, an electroless layer is plated onto the surface feature to form a seed layer for a copper plating operation. In an embodiment, after electroless plating, electrolytic plating is used to complete the formation of the conductive land 144 on the surface feature 140.

In an embodiment, the use of the tilted land grid array reduces the sensitivity of the interconnect to package warpage. In an embodiment, use of a tilted land grid array enables pitch reduction and allowing use of stamped metal contacts 130. Additionally, both the contacts 130 and the lands 144 can be better protected when the tilted land grid array system is used.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is disclosed. Thus, although specific embodiments have been illustrated and described herein, it should be appreciated that any arrangement calculated to achieve the same purpose may be substituted for the specific embodiments shown. The claims are intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An article of manufacture, comprising:
    a circuit substrate having a surface; and
    a land grid contact array having at least one conductive land extending from the surface of the circuit substrate with a generally planar surface thereof oriented non-planar to the surface of circuit substrate,
    wherein the at least one land is formed over a surface feature extending partially above the surface of the substrate and partially recessed into the plane of the substrate surface.

2. The article of claim 1, also including a socket comprising at least one socket contact extending from a socket substrate to conductively engage the generally planar surface of the land as the circuit substrate and socket are moved toward each other.

3. The article of claim 1, wherein the at least one land is supported by a surface feature disposed above the surface of the circuit substrate.

4. The article of claim 1, wherein the at least one land is supported by a surface feature recessed into the surface of the circuit substrate.

5. The article of claim 3, wherein the at least one surface feature is formed from thermoset or thermoplastic material.

6. The article of claim 1, wherein the land is formed of one or more metals selected from the group including copper and copper alloys.

7. The article of claim 1, wherein the surface of the land is generally planar and angled at about 45 degrees to at least one conductive layer of the circuit substrate.

8. An article of manufacture comprising:
    a circuit substrate having a surface;
    a land grid contact array having at least one conductive land extending from the surface of the circuit substrate with a generally planar surface thereof oriented non-planar to the surface of circuit substrate; and a socket comprising at least one socket contact extending from a socket substrate to conductively engage the generally planar surface of the at least one conductive land as the circuit substrate and socket are moved toward each other, wherein the socket contact is constructed and arranged for both lateral and vertical deflection of its extending portion upon engaging the surface of the conductive land, as the socket and the circuit substrate are moved closer to each other.

9. The article of claim 8, wherein the at least one land is formed over a surface feature extending partially above the surface of the substrate and partially recessed into the plane of the substrate surface.

10. The article of claim 8, wherein the at least one land is supported by a surface feature disposed above the surface of the circuit substrate.

11. The article of claim 10, wherein the at least one surface feature is formed from thermoset or thermoplastic material.

12. A method, comprising:
forming a land grid array package with tilted lands formed on a circuit substrate wherein forming the lands includes imprinting at least one surface feature into a surface of the substrate; and applying a conductive layer to the at least one surface feature;

forming a socket comprising at least one socket contact extending from a socket substrate and including an upper contact portion to conductively engage the generally planar surface of the tilted lands as the circuit substrate and the socket are moved toward each other; and moving the tilted lands on the circuit substrate and the socket toward closer together to conductively engage at least one of the tilted lands with the at least one socket contact, wherein the at least one socket contact is constructed and arranged for both lateral and vertical deflection of the upper contact portion upon engaging the surface of the at least one tilted land as the socket and the circuit substrate are moved closer to each other.

13. The method of claim 12, wherein forming the lands includes: forming at least one surface feature above a surface of the land grid array package; and applying a conductive layer to the at least one surface feature.

14. A system, comprising:
a printed circuit board;
a socket;
a plurality of socket contacts arranged on the socket and coupled to terminals on the printed circuit board
a circuit substrate having a plurality of layers, including at least one conductive layer thereon and also having at least one via providing a conductive path from one of the at least one conductive layers to a surface of the circuit substrate; and
at least one land coupled to the at least one via and disposed on the outer surface of the circuit substrate with a conductive surface non-planar to the surface of one of the at least one conductive layers, at least one of the lands positioned on the surface of the circuit substrate to engage one contact of the plurality of contacts to provide a conductive path from a land on the circuit substrate to a terminal on the printed circuit board.

15. The system of claim 14, wherein an electronic circuit die is coupled to the circuit substrate.

16. The system of claim 14, wherein a portion of at least one of the plurality of socket contacts is arranged on the socket projecting above the socket to engage one of the at least one lands disposed on the surface of the circuit substrate.

17. The system of claim 16, wherein the portion of the at least one of the plurality of socket contacts which is arranged on the socket and projects above the socket to engage one of the at least one lands disposed on the surface of the circuit substrate is laterally deflected when the socket and the circuit substrate are moved closer together.

18. The system of claim 17, wherein the portion of the at least one of the plurality of contacts which engages the at least one conductive land does so with a wiping action along the surface of the conductive land as the socket and the circuit substrate are moved toward each other.

19. The system of claim 17, wherein the plurality of contacts are stamped metal.

\* \* \* \* \*